(12) United States Patent
Mineshita (10) Patent No.: US 9,276,184 B2
(45) Date of Patent: Mar. 1, 2016

(54) LED MODULE

(71) Applicant: ROHM CO., LTD., Kyoto-shi, Kyoto (JP)

(72) Inventor: Kentaro Mineshita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/487,725

(22) Filed: Sep. 16, 2014

(65) Prior Publication Data

US 2015/0001575 A1    Jan. 1, 2015

Related U.S. Application Data

(63) Continuation of application No. 13/055,267, filed as application No. PCT/JP2009/063092 on Jul. 22, 2009, now Pat. No. 8,860,066.

(30) Foreign Application Priority Data

Jul. 23, 2008    (JP) ................................. 2008-189756

(51) Int. Cl.
    *H01L 33/62*    (2010.01)
    *H01L 33/48*    (2010.01)
    *H01L 33/54*    (2010.01)
    H01L 25/16    (2006.01)

(52) U.S. Cl.
    CPC .............. *H01L 33/62* (2013.01); *H01L 33/486* (2013.01); *H01L 33/54* (2013.01); *H01L 25/167* (2013.01); *H01L 2224/48247* (2013.01); *H01L 2924/19107* (2013.01)

(58) Field of Classification Search
    CPC ................. H01L 2224/48091; H01L 2924/00; H01L 2224/48247; H01L 2224/48465; H01L 2924/00012; H01L 2924/00014; H01L 2224/32245; H01L 2224/73265; H01L 2924/3025; H01L 2224/97; H01L 2924/12041; H01L 33/62
    See application file for complete search history.

(56) References Cited

U.S. PATENT DOCUMENTS

| 6,376,902 | B1 |  | 4/2002 | Arndt |  |
|---|---|---|---|---|---|
| 6,747,293 | B2 |  | 6/2004 | Nitta et al. |  |
| 7,119,422 | B2 | * | 10/2006 | Chin ....................... | H01L 33/62 257/666 |
| 7,432,589 | B2 | * | 10/2008 | Yamamoto ........ | B29C 45/14639 257/690 |
| 7,462,870 | B2 | * | 12/2008 | Nakashima ....... | H01L 23/49562 257/81 |
| 7,635,915 | B2 | * | 12/2009 | Xie ......................... | H01L 33/62 257/692 |

(Continued)

FOREIGN PATENT DOCUMENTS

| CN |  | 1381906 | 11/2002 |
| JP |  | 2001-518692 | 10/2001 |

(Continued)

*Primary Examiner* — Stephen W Smoot
*Assistant Examiner* — Edward Chin
(74) *Attorney, Agent, or Firm* — Hamre, Schumann, Mueller & Larson, P.C.

(57) ABSTRACT

An LED module A1 includes an LED chip 1, a lead group 4 including a lead 4A on which the LED chip 1 is mounted and a lead 4B spaced apart from the lead 4A, a resin package 2 covering part of the lead group 4, and mounting terminals 41 and 42 provided by part of the lead group 4 that is exposed from the resin package 2 and spaced apart from each other in direction x. The LED module further includes a mounting terminal 43 spaced apart from the mounting terminal 41 in direction y, and a mounting terminal 44 spaced apart from the mounting terminal 42 in direction y. This arrangement allows the LED module A1 to be mounted at a correct position on a circuit board.

20 Claims, 7 Drawing Sheets

(56) References Cited

U.S. PATENT DOCUMENTS

| | | | | |
|---|---|---|---|---|
| 7,875,899 | B2* | 1/2011 | Yasuda | H01L 25/0753 257/88 |
| 7,888,699 | B2* | 2/2011 | Oshio | H01L 25/167 257/99 |
| 7,939,848 | B2* | 5/2011 | Kim | H01L 25/0753 257/100 |
| 8,067,778 | B2* | 11/2011 | Bae | H01L 33/56 257/100 |
| 8,120,151 | B2* | 2/2012 | Ishi | H01L 31/02019 257/66 |
| 8,188,498 | B2* | 5/2012 | Kim | H01L 33/486 257/100 |
| 8,368,112 | B2* | 2/2013 | Chan | H01L 33/62 257/666 |
| 8,378,347 | B2* | 2/2013 | Shimizu | H01L 24/97 257/100 |
| 8,633,506 | B2* | 1/2014 | Kobayakawa | H01L 33/483 257/100 |
| 9,035,439 | B2* | 5/2015 | Xuan | H01L 33/486 174/536 |
| 2004/0256706 | A1* | 12/2004 | Nakashima | H01L 23/49562 257/678 |
| 2006/0049477 | A1* | 3/2006 | Arndt | H01L 33/62 257/433 |
| 2006/0169976 | A1* | 8/2006 | Kameda | H01L 23/49575 257/44 |
| 2007/0284708 | A1 | 12/2007 | Hanya | |
| 2008/0054284 | A1* | 3/2008 | Hussell | H01L 33/54 257/98 |
| 2008/0121921 | A1* | 5/2008 | Loh | H01L 33/642 257/99 |
| 2009/0289274 | A1* | 11/2009 | Park | H01L 33/62 257/99 |
| 2011/0180840 | A1 | 7/2011 | Kim et al. | |
| 2011/0186886 | A1* | 8/2011 | Watari | H01L 33/56 257/98 |
| 2011/0186900 | A1* | 8/2011 | Watari | H01L 24/97 257/99 |
| 2011/0186902 | A1* | 8/2011 | Egoshi | H01L 24/97 257/99 |
| 2012/0080701 | A1* | 4/2012 | Kim | H01L 33/486 257/98 |
| 2012/0103682 | A1* | 5/2012 | Chang | H01L 23/047 174/529 |
| 2012/0132931 | A1* | 5/2012 | Inoue | H01L 33/486 257/88 |

FOREIGN PATENT DOCUMENTS

| | | |
|---|---|---|
| JP | 2007-36293 | 2/2007 |
| JP | 2007-95796 | 4/2007 |
| JP | 2007-329502 | 12/2007 |
| JP | 2007-329516 | 12/2007 |
| JP | 2008-108836 | 5/2008 |
| KR | 10-2007-0055144 | 2/2008 |
| KR | 1020080117579 | 11/2008 |
| TW | 200802993 | 1/2008 |

* cited by examiner

LED MODULE

This application is a Continuation of U.S. Ser. No. 13/055,267 filed Jan. 21, 2011, which is a National Stage Application of PCT/JP2009/063092, filed Jul. 22, 2009, which applications are incorporated herein by reference.

TECHNICAL FIELD

The present invention relates to an LED module including an LED chip as a light source.

BACKGROUND ART

Figure 13:
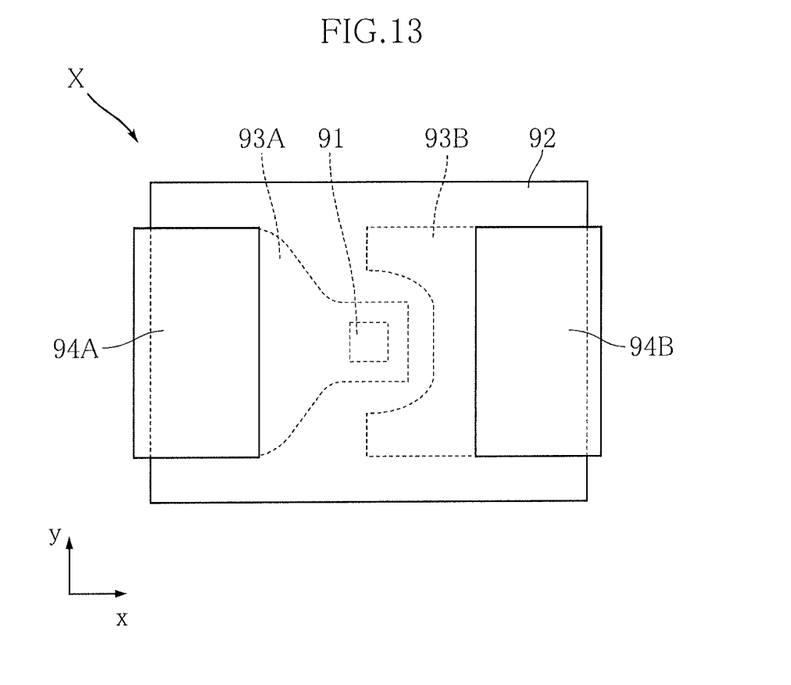
FIG. 13 is a bottom view showing an example of conventional LED module.

FIG. 13 is a bottom view of an example of conventional LED module (see Patent Document 1, for example). The LED module X illustrated in the figure includes an LED chip 91, a resin package 92, and two leads 93A and 93B. The two leads 93A and 93B are spaced apart indirection x, and each of the two leads is partially covered with the resin package 92. The LED chip 91 is the light source of the LED module X and mounted on the lead 93A. Of the two leads 93A and 93B, the portions bent to be positioned on the bottom surface side of the resin package 92 constitute mounting terminals 94A and 94B, which are used for surface-mounting the LED module X.

The surface-mounting of the LED module X on e.g. a circuit board (not shown) is often performed by a reflow process. In this process, with the mounting terminals 94A and 94B provisionally bonded to a wiring pattern of the circuit board via solder paste, the temperature in the reflow furnace is raised to melt the solder paste. In this process, when the surface tension of the molten solder paste adhering to the mounting terminal 94A and the mounting terminal 94B do not balance each other, the LED module X may move from a proper position on the circuit board.

Patent Document 1: JP-A-2007-329516

DISCLOSURE OF THE INVENTION

Problems to be Solved by the Invention

The present invention has been proposed under the circumstances described above. It is therefore an object of the present invention to provide an LED module that can be mounted at a correct position on a circuit board.

Means for Solving the Problems

An LED module provided according to the present invention includes: an LED chip; a lead group including a first lead on which the LED chip is mounted and a second lead spaced apart from the first lead; a resin package covering part of the lead group; and a first and a second mounting terminals provided by part of the lead group that is exposed from the resin package and spaced apart from each other in a first direction. The LED module further includes a third mounting terminal spaced apart from the first mounting terminal in a second direction perpendicular to the first direction, and a fourth mounting terminal spaced apart from the second mounting terminal in the second direction.

In a preferred embodiment of the present invention, the lead group further comprises a third lead spaced apart from the first and the second leads and partially covered with the resin package. The first and the third mounting terminals are provided by part of the first lead. The second mounting terminal is provided by part of the second lead. The fourth mounting terminal is provided by part of the third lead.

In a preferred embodiment of the present invention, the lead group further includes a third lead spaced apart from the first and the second leads and partially covered with the resin package. The first and the second mounting terminals are provided by part of the first lead. The third mounting terminal is provided by part of the third lead. The fourth mounting terminal is provided by part of the second lead.

In a preferred embodiment of the present invention, the lead group further includes a third lead spaced apart from the first and the second leads and partially covered with the resin package. The first and the fourth mounting terminals are provided by part of the first lead. The second mounting terminal is provided by part of the second lead. The third mounting terminal is provided by part of the third lead.

In a preferred embodiment of the present invention, the lead group further includes a third and a fourth leads spaced apart from the first and the second leads and partially covered with the resin package. The first mounting terminal is provided by part of the first lead. The second mounting terminal is provided by part of the second lead. The third mounting terminal is provided by part of the third lead. The fourth mounting terminal is provided by part of the fourth lead.

In a preferred embodiment of the present invention, the first and the third mounting terminals are provided by part of the first lead, and the second and the fourth mounting terminals are provided by part of the second lead.

Other features and advantages of the present invention will become more apparent from the detailed description given below with reference to the accompanying drawings.

BEST MODE FOR CARRYING OUT THE INVENTION

Preferred embodiments of the present invention are described below with reference to the accompanying drawings.

FIGS. 1-4 show an LED module according to a first embodiment of the present invention. The LED module A1 of this embodiment includes an LED chip 1, a resin package 2, light-transmitting resin 3 and a lead group 4.

The LED chip 1 is the light source of the LED module A1. The LED chip 1 has a lamination structure made up of an n-type semiconductor layer mainly composed on e g GaN, an active layer and a p-type semiconductor layer, and emits blue light. The LED chip 1 is provided with an electrode (not shown) on the upper surface. The electrode is connected to the lead group 4 by a wire 51. For instance, the LED chip 1 is 0.2 to 0.3 mm square in plan view and about 0.15 mm in height. The wavelength of the light emitted from the LED chip 1 depends on the material of the LED chip, and the LED chip may emit visible light other than blue light or invisible light such as infrared light or ultraviolet light.

The resin package 2 is made of e.g. a white resin and generally in the form of a rectangular parallelepiped as a whole. The resin package 2 covers part of the lead group 4. The resin package 2 is formed with an annular inner surface. The annular inner surface surrounds the LED chip 1.

The light-transmitting resin 3 covers the LED chip 1 and fills the space surrounded by the annular inner surface. In this embodiment, the light-transmitting resin 3 is made of a material obtained by mixing a fluorescent material in a transparent resin. As the fluorescent material, use may be made of e.g. YAG:$Ce^{3+}$, which emits yellow light when excited by blue light. With this arrangement, white light is emitted from the LED module A1. Unlike this embodiment, the light-transmitting resin 3 may be made of a transparent resin or the like, which allows light from the LED chip 1 to pass through.

The lead group 4 is made up of leads 4A, 4B and 4C. The leads 4A, 4B and 4C are plate-like parts made of an alloy of Cu or Ni, for example. Alternatively, the leads may be made of the above-described alloy plated with Ag. The lead 4A includes a pad 45A. The pad 45A is positioned substantially at the center of the LED module A1, and the LED chip 1 is mounted on the pad. The lead 4A includes two strip portions projecting from the resin package 2 in direction x parallel to each other. Of these strip portions, the portions bent to the bottom surface side of the resin package 2 constitute mounting terminals 41 and 43. The mounting terminals 41 and 43 are spaced apart in direction y and used for surface-mounting the LED module A1.

The leads 4B and 4C are spaced apart from the lead 4A in direction x. The leads 4B and 4C are substantially parallel and spaced apart from each other in direction y. The leads 4B and 4C include pads 45B, 45C and protruding portions 47B, 47C. The pads 45B, 45C are used for bonding wires 51, 52 53, 54, which will be described later, or mounting elements such as a zener diode. The protruding portions 47B and 47C protrude in direction y. The leads 4B and 4C partially project from the resin package 2 in direction x and are further bent to the bottom surface side of the resin package 2. These bent portions constitute mounting terminals 42 and 44. The mounting terminals 42 and 44 are spaced apart from each other in direction y and spaced apart from the mounting terminals 41 and 43 in direction x. The mounting terminals 42 and 44 are used for surface-mounting the LED module A1.

The advantages of the LED module A1 are described below.

According to this embodiment, in surface-mounting the LED module A1, solder paste is applied between the circuit board and the four mounting terminals 41, 42, 43, 44. When the solder paste melts, surface tension acts on each of the four mounting terminals 41, 42, 43, 44. As compared with the conventional structure shown in FIG. 13, in which surface tension acts on only two points, the present embodiment, in which surface tension acts on four points, achieves a good balance of surface tension more easily. Thus, this embodiment allows the LED module A1 to be mounted at a correct position on a circuit board.

Further, according to this embodiment, the polarity of the mounting terminals 41, 42, 43, 44 can be changed easily in the process of manufacturing the LED module A1. For instance, in FIG. 4, when the wires 51 and 52 only are provided, the mounting terminals 41 and 43 can be set as negative terminals, whereas the mounting terminals 42 and 44 can be set as positive terminals. When the wires 51 and 53 only are provided, the mounting terminals 41, 43 and 44 can be set as positive terminals, whereas the mounting terminal 42 can be set as a negative terminal. When the wire 51 only is provided, the mounting terminals 41 and 43 can be set as negative terminals, the mounting terminal 42 as a positive terminal, and the mounting terminal 44 as a non-used state. Since the polarity can be changed easily in this way, even when the polarity of the circuit board, on which the LED module A1 is to be mounted, is changed, the LED module A1 can be adapted to such a circuit board without significantly changing its structure.

Figure 4:
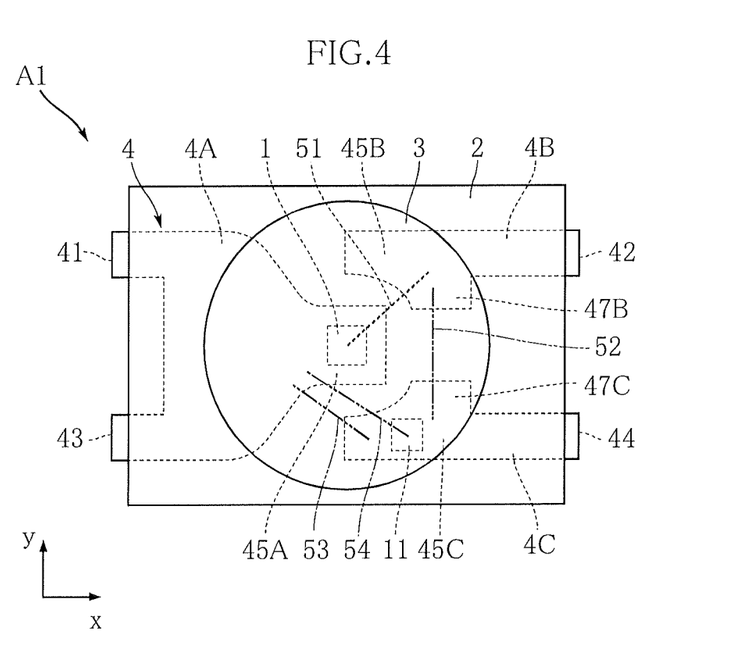
FIG. 4 is a plan view showing the LED module according to the first embodiment of the present invention.

When a zener diode 11 is mounted on the pad 45C of the lead 4C as shown in FIG. 4 and the wires 51, 52 and 54 only are provided, application of excessive reverse voltage on the LED module A1 is prevented.

Figure 1:
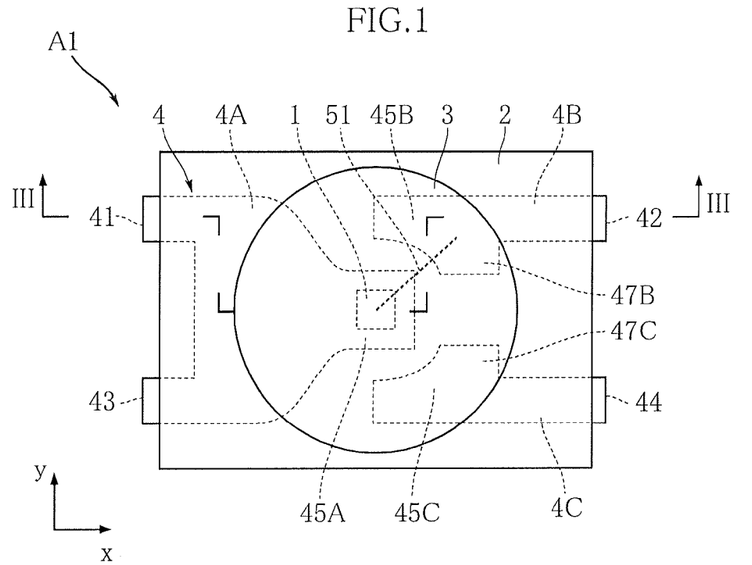
FIG. 1 is a plan view showing an LED module according to a first embodiment of the present invention.
Figure 2:
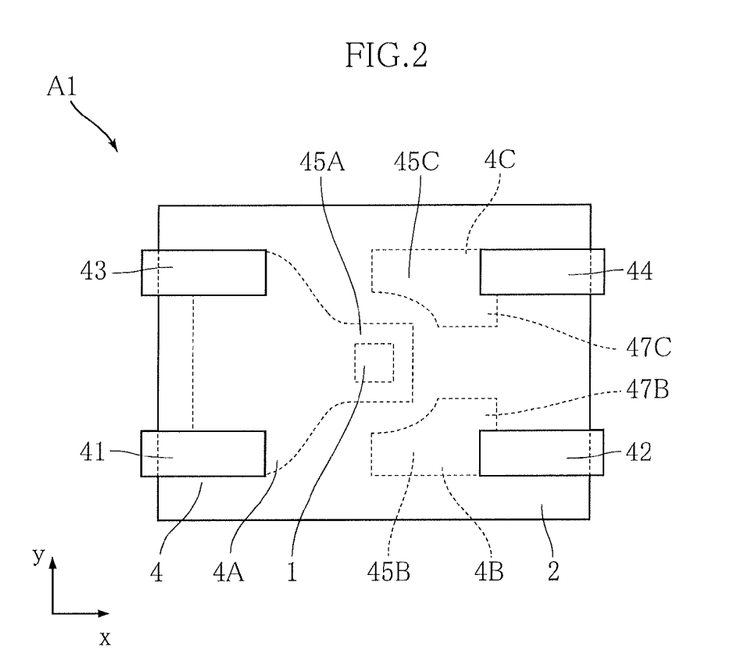
FIG. 2 is a bottom view showing the LED module according to the first embodiment of the present invention.
Figure 3:
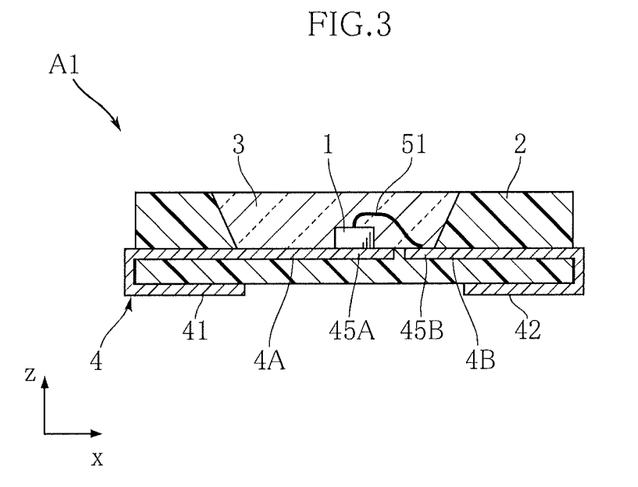
FIG. 3 is a sectional view taken along lines in FIG. 1.

When a force to pull out the leads 4B and 4C in direction x is applied, the protruding portions 47B and 47C react against the force. Thus, the leads 4B and 4C are prevented from coming off. Also as to the lead 4A, the portion between the two strip portions functions to prevent the lead 4A from coming off.

Although this embodiment includes a single LED chip 1, the LED module according to the present invention is not limited to this arrangement, and a plurality of LED chips 1 may be mounted on the pad 45A.

FIGS. 5-12 show other embodiments of the present invention. In these figures, the elements which are identical or similar to those of the foregoing embodiment are designated by the same reference signs as those used for the foregoing embodiment.

Figure 5:
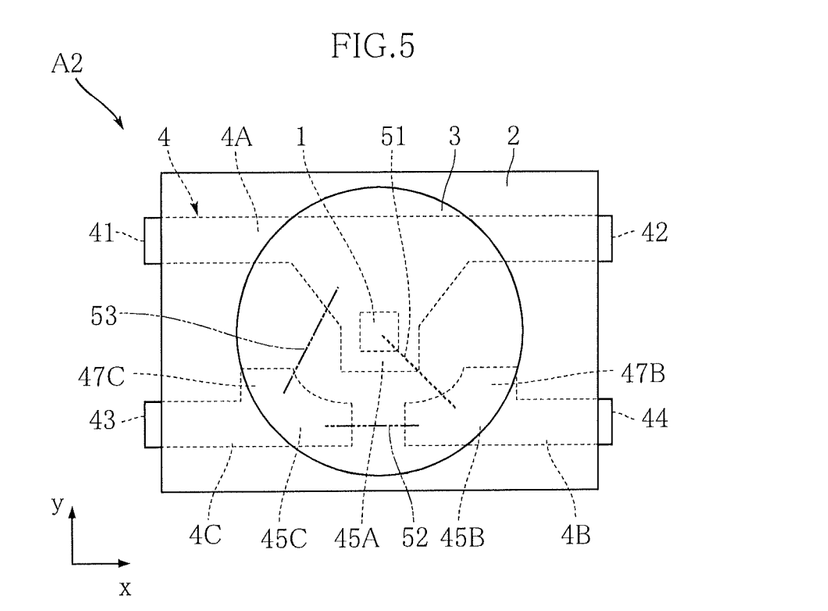
FIG. 5 is a plan view showing an LED module according to a second embodiment of the present invention.
Figure 6:
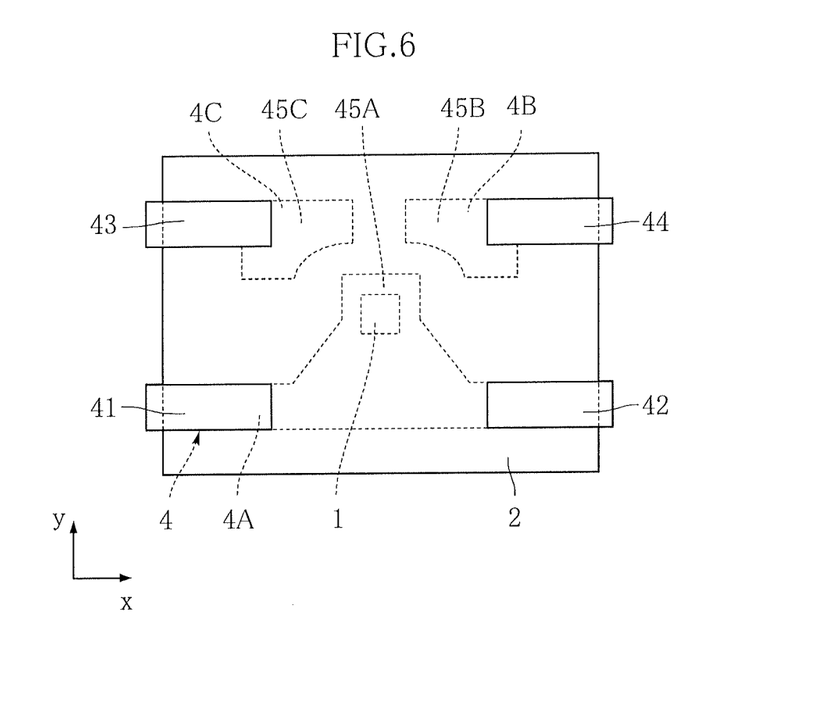
FIG. 6 is a bottom view showing the LED module according to the second embodiment of the present invention.

FIGS. 5 and 6 show an LED module according to a second embodiment of the present invention. The LED module A2 of this embodiment differs from the foregoing embodiment in structure of the leads 4A, 4B and 4C. Specifically, in this embodiment, the lead 4A extends substantially straight to penetrate the resin package 2 in direction x. The leads 4B and 4C are spaced apart from the lead 4A in direction y and spaced apart from each other in direction x. Mounting terminals 41 and 42 are provided by part of the lead 4A, the mounting terminal 43 is provided by the lead 4C, and the mounting terminal 44 is provided by the lead 4B.

Similarly to the foregoing embodiment, this arrangement also allows the LED module A2 to be mounted at a relatively correct position on a circuit board. Moreover, as shown in FIG. 5, when the wires 51 and 52 only are provided, the mounting terminals 41 and 42 can be set as negative terminals, whereas the mounting terminals 43 and 44 can be set as positive terminals. When the wires 51 and 53 only are provided, the mounting terminals 41, 42 and 43 can be set as negative terminals, whereas the mounting terminal 44 can be set as a positive terminal. When the wire 51 only is provided, the mounting terminals 41 and 42 can be set as negative terminals, the mounting terminal 44 as a positive terminal, and the mounting terminal 43 as a non-used state.

Figure 7:
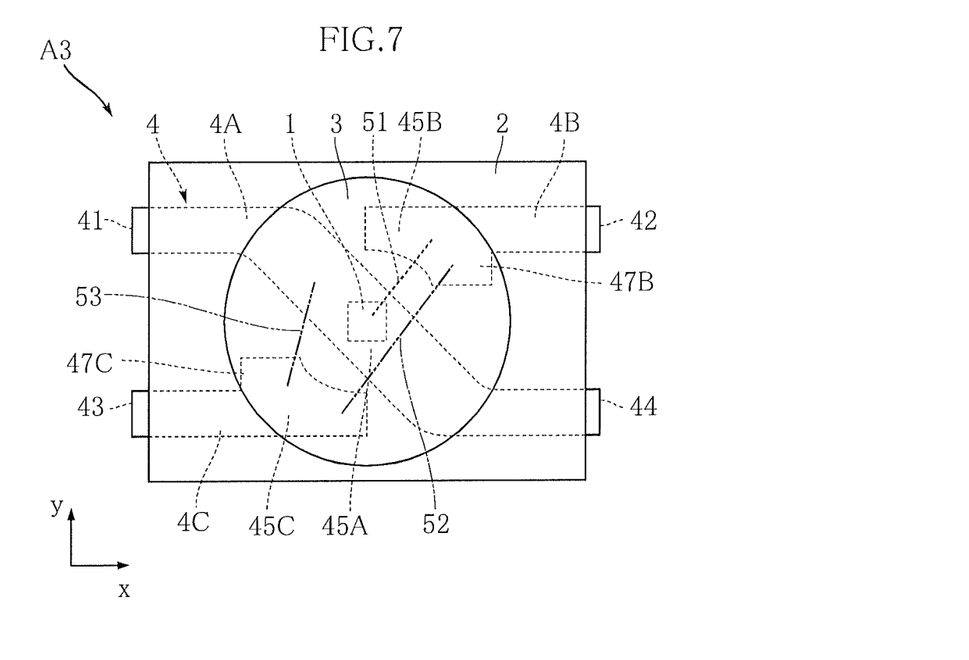
FIG. 7 is a plan view showing an LED module according to a third embodiment of the present invention.
Figure 8:
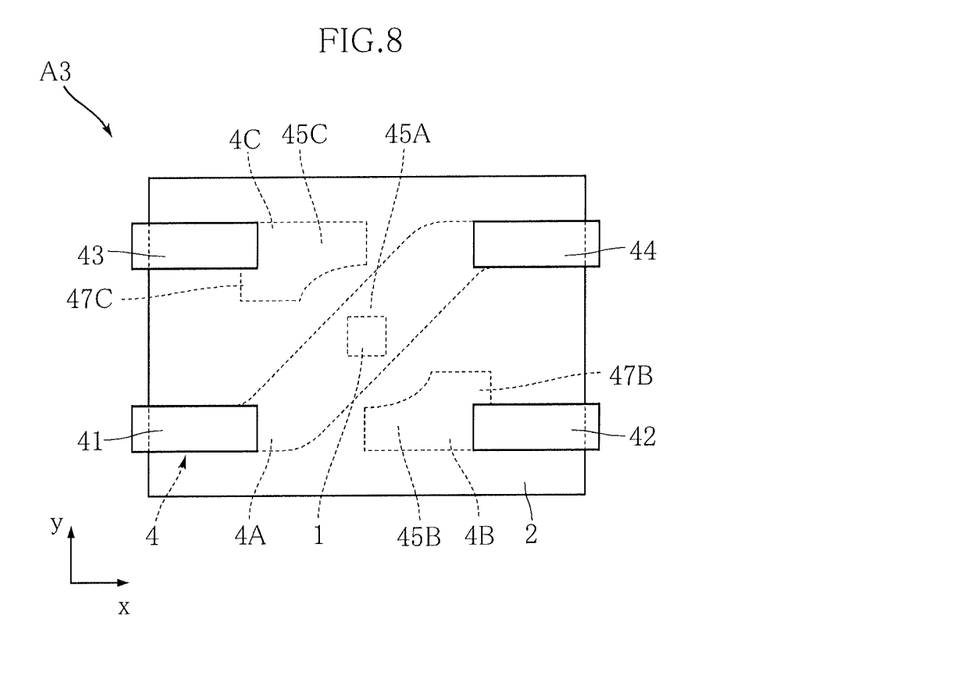
FIG. 8 is a bottom view showing the LED module according to the third embodiment of the present invention.

FIGS. 7 and 8 show an LED module according to a third embodiment of the present invention. The LED module A3 of this embodiment is different from those of the foregoing embodiments in structure of the leads 4A, 4B and 4C. Specifically, in this embodiment, the lead 4A penetrates the resin package 2 obliquely to both of direction x and direction y. The leads 4B and 4C are arranged at two diagonal corners of the resin package 2, which is rectangular in plan view, to sandwich the lead 4A. Mounting terminals 41 and 44 are provided by part of the lead 4A, the mounting terminal 42 is provided by the lead 4B, and the mounting terminal 43 is provided by the lead 4C.

This arrangement also allows the LED module A3 to be mounted at a relatively correct position on a circuit board. Moreover, as shown in FIG. 7, when the wires 51 and 52 only are provided, the mounting terminals 41 and 44 can be set as negative terminals, whereas the mounting terminals 42 and 43 can be set as positive terminals. When the wires 51 and 53 only are provided, the mounting terminals 41, 43 and 44 can be set as negative terminals, whereas the mounting terminal 42 can be set as a positive terminal. When the wire 51 only is provided, the mounting terminals 41 and 44 can be set as negative terminals, the mounting terminal 42 as a positive terminal, and the mounting terminal 43 as a non-used state.

Figure 9:
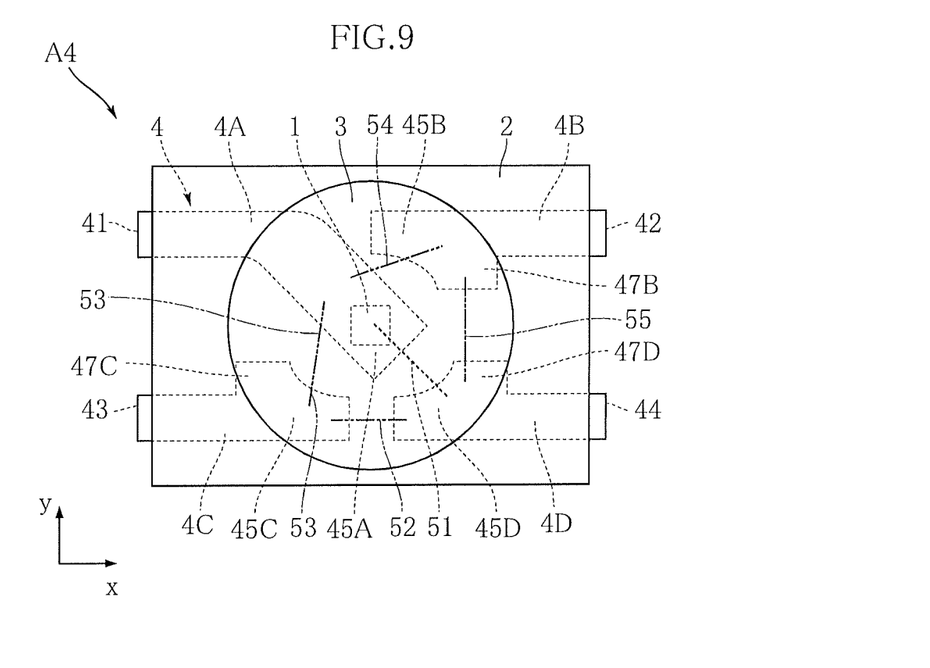
FIG. 9 is a plan view showing an LED module according to a fourth embodiment of the present invention.
Figure 10:
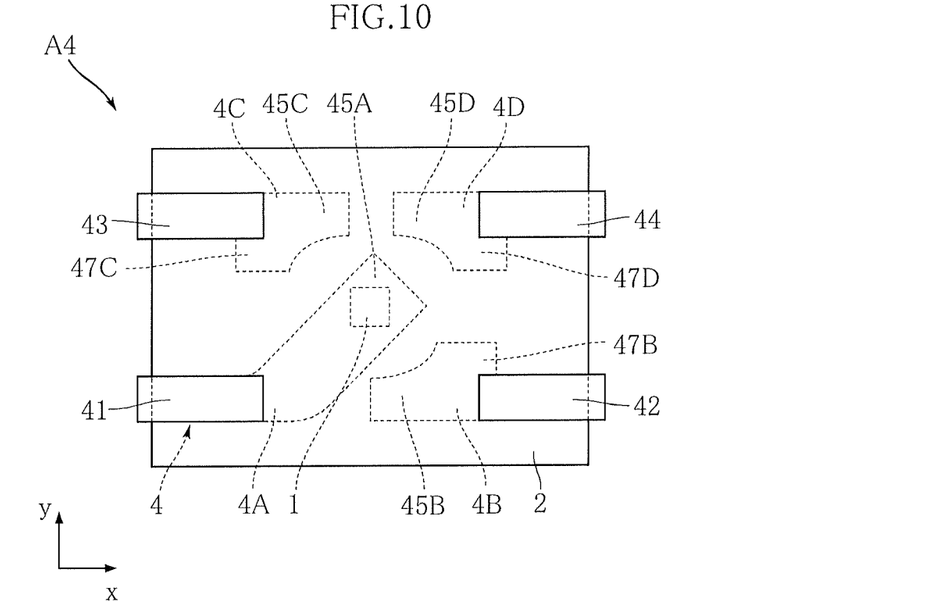
FIG. 10 is a bottom view showing the LED module according to the fourth embodiment of the present invention.

FIGS. 9 and 10 show an LED module according to a fourth embodiment of the present invention. The LED module A4 of this embodiment is different from those of the foregoing embodiments in structure of the lead group 4. Specifically, in this embodiment, the lead group 4 is made up of four leads 4A, 4B, 4C and 4D. These leads 4A, 4B, 4C and 4D are arranged adjacent to four corners of the resin package 2, which is rectangular in plan view. The lead 4A includes a pad 45A on which the LED chip 1 is mounted. The leads 4B, 4C and 4D include protruding portions 47B, 47C and 47D, respectively. The mounting terminal 41 is provided by the lead 4A, the mounting terminal 42 is provided by the lead 4B, and the mounting terminal 43 is provided by the lead 4C and the mounting terminal 44 is provided by the lead 4D.

Similarly to the foregoing embodiments, this arrangement also allows the LED module A4 to be mounted at a relatively correct position on a circuit board. Moreover, as shown in FIG. 9, when the wires 51, 52 and 54 only are provided, the mounting terminals 41 and 42 can be set as negative terminals, whereas the mounting terminals 43 and 44 can be set as positive terminals. When the wires 51, 52 and 55 only are provided, the mounting terminal 41 can be set as a negative terminal, whereas the mounting terminals 42, 43 and 44 can be set as positive terminals. When the wires 51 and 52 only are provided, the mounting terminal 41 can be set as a negative terminal, the mounting terminals 43 and 44 as positive terminals, and the mounting terminal 42 as a non-used state. When the wire 51 only is provided, the mounting terminal 41 can be set as a negative terminal, the mounting terminal 44 as a positive terminal, and the mounting terminals 42 and 43 as a non-used state. In this way, the lead group 4 made up of four leads 4A, 4B, 4C and 4D provides an increased number of polarity pattern choices with respect to the mounting terminals 41, 42, 43 and 44.

Figure 11:
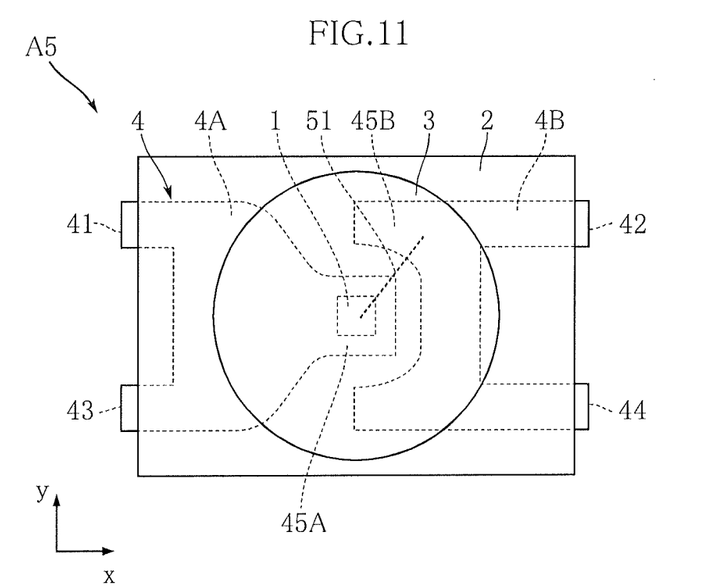
FIG. 11 is a plan view showing an LED module according to a fifth embodiment of the present invention.
Figure 12:
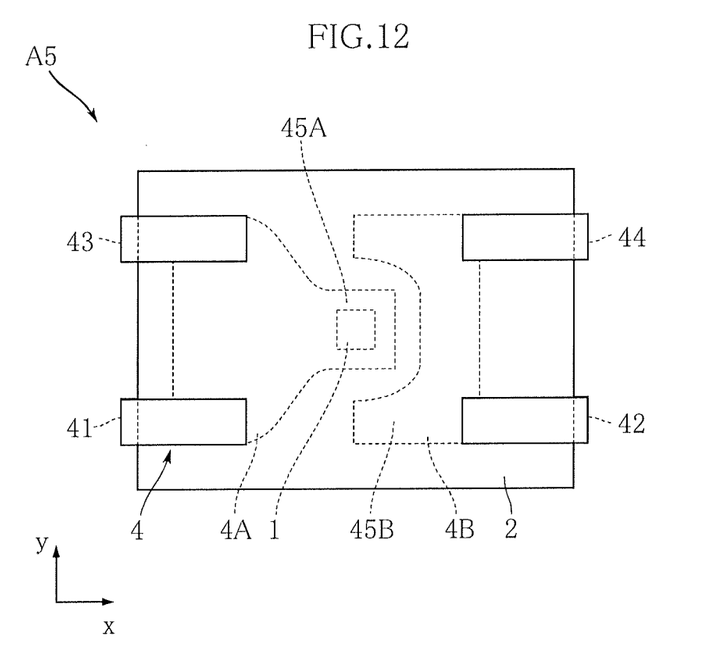
FIG. 12 is a bottom view showing the LED module according to the fifth embodiment of the present invention.

FIGS. 11 and 12 show an LED module according to a fifth embodiment of the present invention. The LED module A5 of this embodiment is different from those of the foregoing embodiments in structure of the lead group 4. Specifically, the mounting terminals 41 and 43 are provided by the lead 4A, whereas the mounting terminals 42 and 44 are provided by the lead 4B. Similarly to the foregoing embodiments, this arrangement also allows the LED module A5 to be mounted at a relatively correct position on a circuit board.

The LED module according to the present invention is not limited to the foregoing embodiments. The specific structure of each part of the LED module according to the present invention can be varied in design in many ways.

The invention claimed is:
1. An LED module comprising:
an LED chip;
a lead group including a plurality of individual leads that are spaced apart from each other; and
a resin package partly covering the lead group;
wherein the lead group forms a first mounting terminal, a second mounting terminal, a third mounting terminal and a fourth mounting terminal each exposed from the resin package,
wherein the first mounting terminal and the second mounting terminal are spaced apart from each other in a first direction, the third mounting terminal is spaced apart from the first mounting terminal in a second direction perpendicular to the first direction, and the fourth mounting terminal is spaced apart from the second mounting terminal in the second direction,
wherein the plurality of individual leads include a first lead and a second lead,
wherein the LED chip is mounted on the first lead, and the first mounting terminal is formed by a part of the first lead, and
wherein one of the second mounting terminal, the third mounting terminal and the fourth mounting terminal is formed by another part of the first lead, and at least one of the remaining two of the second mounting terminal, the third mounting terminal and the fourth mounting terminal is formed by a part of the second lead, and
wherein the second lead has a concave edge facing the LED chip.

2. The LED module according to claim 1, wherein the plurality of individual leads include a third lead, and
wherein the second mounting terminal is formed by said another part of the first lead, the third mounting terminal is formed by a part of the third lead, and the fourth mounting terminal is formed by a part of the second lead.

3. The LED module according to claim 2, wherein the first lead includes a strip portion extending in the first direction between the first mounting terminal and the second mounting terminal, and the first lead further includes a protruding portion extending in the second direction from the strip portion, the LED chip being disposed at the protruding portion.

4. The LED module according to claim 1, wherein the fourth mounting terminal is formed by said another part of the first lead, and offset from the first mounting terminal in the second direction.

5. The LED module according to claim 4, wherein the first lead includes a strip portion extending between the first mounting terminal and the fourth mounting terminal, the LED chip being disposed at the strip portion.

6. The LED module according to claim 5, wherein the second mounting terminal is formed by a part of the second lead.

7. The LED module according to claim 6, wherein the third mounting terminal is electrically connected to the first lead.

8. The LED module according to claim 6, further comprising a wire connecting the second lead and the LED chip to each other.

9. The LED module according to claim 8, wherein the second lead includes a pad to which the wire is bonded, and at least a part of the pad overlaps the LED chip as viewed in the second direction.

10. The LED module according to claim 6, wherein the plurality of individual leads include a third lead, and the third mounting terminal is formed by a part of the third lead.

11. The LED module according to claim 10, wherein the second lead and the third lead are spaced apart from each other with the strip portion of the first lead intervening between the second lead and the third lead.

12. The LED module according to claim 11, further comprising a wire connecting the second lead and the third lead to each other.

13. The LED module according to claim 1, wherein the third mounting terminal is formed by said another part of the first lead, and each of the second mounting terminal and the fourth mounting terminal is formed by a part of the second lead.

14. The LED module according to claim 1, wherein the first mounting terminal and the third mounting terminal protrude from the resin package in a same direction.

15. The LED module according to claim 1, wherein the resin package is white.

16. The LED module according to claim 1, wherein the resin package is formed with an annular inner surface, and
wherein the LED chip and a portion of the first lead are surrounded by the annular inner surface.

17. The LED module according to claim 16, further comprising a light-transmitting resin filled in a space defined by the annular inner surface of the resin package, wherein the LED chip is covered with the light-transmitting resin.

18. The LED module according to claim 16,
wherein the second lead includes an enlarged portion adjacent to the first lead and protruding in the second direction, at least a part of the enlarged portion being surrounded by the annular inner surface.

19. The LED module according to claim 18, wherein the concave edge is adjacent to the enlarged portion.

20. An LED module comprising:
an LED chip;
a lead group including a plurality of individual leads that are spaced apart from each other, the plurality of individual leads including a first lead, a second lead, a third lead and a fourth lead, the LED chip being mounted on the first lead; and
a resin package partly covering the lead group;
wherein the lead group forms a first mounting terminal, a second mounting terminal, a third mounting terminal and a fourth mounting terminal each exposed from the resin package,
wherein the first mounting terminal and the second mounting terminal are spaced apart from each other in a first direction, the third mounting terminal is spaced apart from the first mounting terminal in a second direction perpendicular to the first direction, and the fourth mounting terminal is spaced apart from the second mounting terminal in the second direction,
wherein the first mounting terminal is formed by a part of the first lead, the second mounting terminal is formed by a part of the second lead, the third mounting terminal is formed by a part of the third lead, and the fourth mounting terminal is formed by a part of the fourth lead, and
wherein at least one of the second lead, the third lead and the fourth lead has a concave edge facing the LED chip.

* * * * *